(12) United States Patent
Kanda et al.

(10) Patent No.: US 7,741,694 B2
(45) Date of Patent: Jun. 22, 2010

(54) SEMICONDUCTOR INTEGRATED CIRCUIT DEVICE

(75) Inventors: Ryo Kanda, Gunma (JP); Shigeaki Okawa, Tochigi (JP); Kazuhiro Yoshitake, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 578 days.

(21) Appl. No.: 10/950,611

(22) Filed: Sep. 27, 2004

(65) Prior Publication Data

US 2005/0082632 A1 Apr. 21, 2005

(30) Foreign Application Priority Data

Sep. 29, 2003 (JP) ............................ 2003-338866

(51) Int. Cl.
*H01L 29/00* (2006.01)
(52) U.S. Cl. ................ 257/500; 257/565; 257/E29.012
(58) Field of Classification Search ................. 257/499, 257/500, 565, E29.012
See application file for complete search history.

(56) References Cited

U.S. PATENT DOCUMENTS

| | | | | |
|---|---|---|---|---|
| 4,458,158 A | * | 7/1984 | Mayrand | ................ 326/101 |
| 4,721,684 A | * | 1/1988 | Musumeci | ................ 438/329 |
| 5,157,419 A | * | 10/1992 | Matsumoto et al. | ........... 347/59 |
| 5,159,427 A | * | 10/1992 | Ogura et al. | ................ 257/500 |
| 5,500,551 A | * | 3/1996 | Puzzolo et al. | ............... 257/500 |
| 5,726,696 A | * | 3/1998 | Saito et al. | ..................... 347/59 |
| 5,801,420 A | * | 9/1998 | Fujishima | ................... 257/343 |
| 6,225,673 B1 | * | 5/2001 | Pendharkar et al. | ......... 257/502 |
| 2001/0040266 A1 | * | 11/2001 | Pozzoni et al. | ............. 257/500 |
| 2002/0175392 A1 | * | 11/2002 | Jeon et al. | ..................... 257/500 |

FOREIGN PATENT DOCUMENTS

JP 06-104459 4/1994

OTHER PUBLICATIONS

Miura, H. (ed.), *Handybook Mechatronics*, Tokyo: Ohmsha, Ltd., Mar. 25, 1996, pp. 204-205.

* cited by examiner

*Primary Examiner*—Matthew E Warren
(74) *Attorney, Agent, or Firm*—Fissh & Richardson P.C.

(57) ABSTRACT

A semiconductor integrated circuit device according to the present invention includes an N-type embedded diffusion region between a substrate and an epitaxial layer in first and second island regions serving as small signal section. The N-type embedded diffusion region connects to N-type diffusion regions having supply potential. The substrate and the epitaxial layer are thus partitioned by the N-type embedded diffusion region having supply potential in the island regions serving as small signal section. This structure prevents the inflow of free carriers (electrons) generated from a power NPN transistor due to the back electromotive force of the motor into the small signal section, thus preventing the malfunction of the small signal section.

11 Claims, 5 Drawing Sheets

SEMICONDUCTOR INTEGRATED CIRCUIT DEVICE

BACKGROUND OF THE INVENTION

1. Field of the Invention

The present invention relates to a semiconductor integrated circuit device in which the malfunction of a motor drive circuit due to a parasitic effect is prevented.

2. Description of the Related Art

Conventional three-phase motor drivers have three parallel-connected transistors (Tr1-Tr2, Tr3-Tr4, and Tr5-Tr6) each connected in series between direct-current power supplies VCC and GND. Output terminals taken from between Tr1-Tr2, Tr3-Tr4, and Tr5-Tr6 are connected to a motor M. Thus, normal/back electromotive force is generated as the motor rotates/stops. It is proposed in the art to provide a structure in which a protective diode is connected between the collector and the emitter of the transistors to dissipate the electromotive force to a fixed potential, thereby protecting the interior of an IC including the series transistors (for example, refer to Patent Document: JP-A-6-104459, pp. 13-14, FIGS. 16-17).

Also a conventional normal/reverse rotation control circuit of a DC motor is disclosed (for example, refer to Nonpatent Document: Hirobumi Miura; "Mechatronics," Ohmsha, Ltd., pp. 204-205.

In the conventional semiconductor integrated circuit devices, for example, during ON to OFF transition of a driver device, backward electromotive force (hereinafter, referred to as back electromotive force) is generated from a motor. Thus a negative potential is applied to the collector region of the driver device for driving the motor by the back electromotive force. Accordingly, free carriers (electrons) are generated from a PN junction between the emitter region and the base region of a parasitic transistor constructed of a driver device, a substrate, and a control device. The free carriers (electrons) flow from an island region having the driver device to the other island regions via the substrate. Particularly, when the free carriers (electrons) flow into the control device for controlling the driver device, the control device fails to function normally. This causes the driver device which should be in OFF action to make ON action to send an incorrect signal, thus interfering with the normal operation of the motor.

SUMMARY OF THE INVENTION

The present invention has been made in consideration of the foregoing problems. A semiconductor integrated circuit device according to the invention includes a semiconductor layer and dividing regions dividing the semiconductor layer into a plurality of island regions comprising at least an island region incorporating a driver device for driving a motor and at least another island region incorporating a control device for controlling the driver device. The island region having the control device has a single-conductivity-type embedded diffusion region having supply potential. The single-conductivity-type embedded diffusion region is disposed so as to separate an opposite-conductivity-type semiconductor substrate of the semiconductor layer and a device formed region where the control device is formed from each other. Accordingly, in the semiconductor integrated circuit device according to the invention, the device formed region in the island region having a control device is separated from the substrate by the single-conductivity-type embedded diffusion region having supply potential. This prevents the inflow of free carriers (electrons) generated from the driver device by the back electromotive force of the motor into the control device through the substrate. The free carriers (electrons) are attracted through the single-conductivity-type embedded diffusion region. Thus, a malfunction of the control device due to the free carriers (electrons) generated from the driver device can be prevented.

In the semiconductor integrated circuit device according to the invention, the island region having the control device has a grounded opposite-conductivity-type embedded diffusion region, the opposite-conductivity-type embedded diffusion region being disposed closer to a surface of the semiconductor layer relative to the single-conductivity-type embedded diffusion region. Accordingly, in the semiconductor integrated circuit device of the invention, the opposite-conductivity-type embedded diffusion region is disposed closer to the surface of the semiconductor layer relative to the single-conductivity-type embedded diffusion region in the island region having the control device. The opposite-conductivity-type embedded diffusion region is grounded; the single-conductivity-type embedded diffusion region has supply potential. The free carriers (electrons) generated from the driver device by the back electromotive force of the motor are therefore attracted through the single-conductivity-type embedded diffusion region. Thus the opposite-conductivity-type embedded diffusion region serves as a substrate.

A semiconductor integrated circuit device according to the invention includes a semiconductor layer and dividing regions dividing the semiconductor layer into a plurality of island regions comprising at least an island region incorporating a driver device for driving a motor and at least another island region incorporating a control device for controlling the driver device. The island region having the driver device has a single-conductivity-type embedded diffusion region having supply potential. The single-conductivity-type embedded diffusion region is disposed so as to separate an opposite-conductivity-type semiconductor substrate of the semiconductor layer and a device formed region where the driver device is formed from each other. Accordingly, in the semiconductor integrated circuit device of the invention, the device formed region in the island region having a driver device is separated from the substrate by the single-conductivity-type embedded diffusion region having supply potential. This prevents the inflow of free carriers (electrons) generated from the driver device by the back electromotive force of the motor into the control device through the substrate. The free carriers (electrons) are attracted through the single-conductivity-type embedded diffusion region. Thus, a malfunction of the control device due to the free carriers (electrons) generated from the driver device can be prevented.

The semiconductor integrated circuit device according to the invention includes at least an island region having a motor-driving device and an island region having a control device for controlling the driver device. The device formed region in the island region having the control device is separated from the substrate by a single-conductivity-type embedded diffusion region having supply potential. Thus free carriers (electrons) generated from the PN junction of the driver device by the back electromotive force of the motor are prevented from flowing into the control device by the single-conductivity-type embedded diffusion region. Thus the malfunction of the control device due to the free carriers (electrons) can be prevented and as such, the malfunction of the driver device can be prevented.

In the semiconductor integrated circuit device according to the invention, an opposite-conductivity-type embedded diffusion region is disposed so as to overlap with the single-conductivity-type embedded diffusion region in the island region having a control device. The opposite-conductivity-type embedded diffusion region is disposed closer to an upper surface of the semiconductor layer relative to the single-conductivity-type diffusion region. The opposite-conductivity-type embedded diffusion region is grounded via a dividing region. Accordingly, the opposite-conductivity-type embedded diffusion region serves as a substrate of the control device.

The semiconductor integrated circuit device according to the invention includes at least an island region having a motor-driving device and an island region having a control device for controlling the driver device. The device formed region in the island region having the driver device is separated from the substrate by a single-conductivity-type embedded diffusion region having supply potential. Thus free carriers (electrons) generated from the PN junction of the driver device by the back electromotive force of the motor are prevented from flowing into the substrate by the single-conductivity-type embedded diffusion region. This prevents the inflow of the free carriers (electrons) into the control device through the substrate. Thus the malfunction of the control device can be prevented and as such, the malfunction of the driver device can be prevented.

DESCRIPTION OF THE PREFERRED EMBODIMENTS

A semiconductor integrated circuit device according to embodiments of the invention will be specifically described with reference to FIGS. 1 to 5.

FIGS. 1, 3, 4, and 5 are cross-sectional views of the semiconductor integrated circuit device according to embodiments of the present invention. FIG. 2 is part of the circuit diagram of the semiconductor integrated circuit device according to embodiments of the invention.

Figure 1:
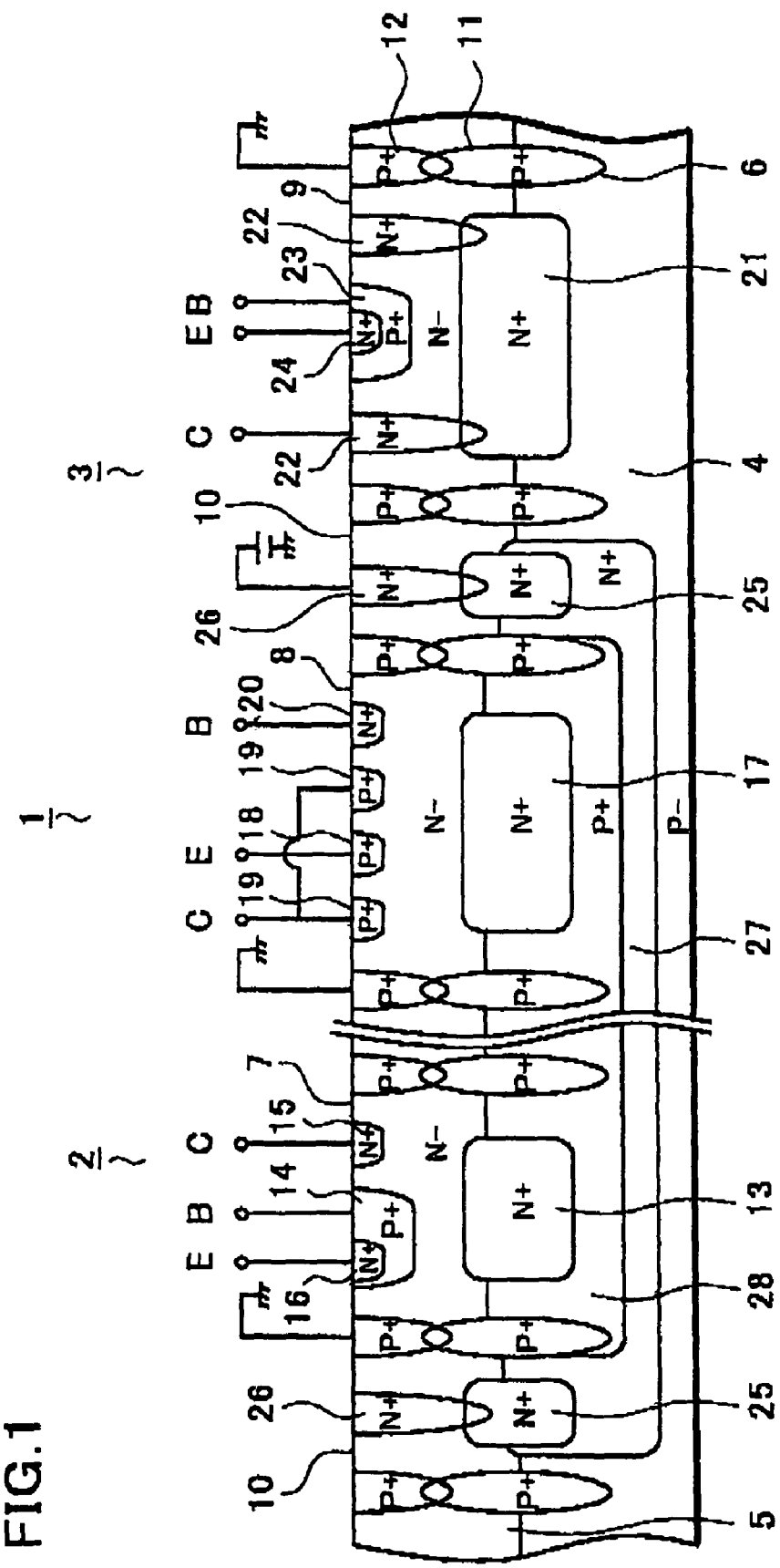
FIG. 1 is a cross-sectional view of a semiconductor integrated circuit device according to an embodiment of the present invention.
Figure 2:
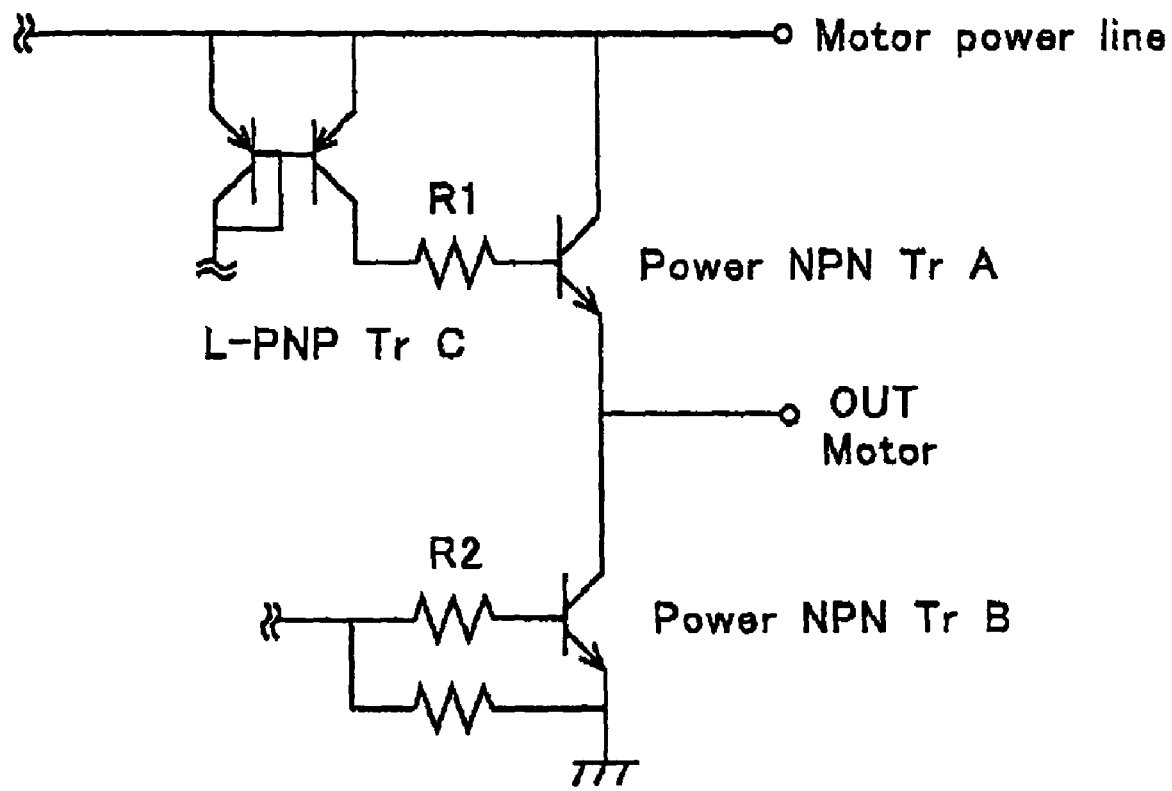
FIG. 2 is a circuit diagram of the semiconductor integrated circuit device according to the embodiment of the invention.

Referring to FIG. 1, an N-type epitaxial layer 5 in a thickness of 2 to 10 µm is formed on a P-type monocrystal silicon substrate 4. The substrate 4 and the epitaxial layer 5 are divided into a first island region 7, a second island region 8, a third island region 9, and a fourth island region 10 by P-type dividing regions 6 which pass therethrough. Although not shown, the substrate 4 and the epitaxial layer 5 also have the other island regions divided by the dividing regions 6. The other island regions include various devices such as an integrated injection logic (IIL).

Each of the dividing regions 6 includes a first dividing region 11 extending vertically from the surface of the substrate 4 and a second dividing region 12 extending from the surface of the epitaxial layer 5. The first and second dividing regions 11 and 12 are joined together to divide the substrate 4 and the epitaxial layer 5 into islands.

A semiconductor integrated circuit device 1 according to an embodiment of the invention has an NPN transistor and a horizontal PNP transistor which construct a small signal section 2 in the first and second island regions 7 and 8, and has a power NPN transistor 3 serving as motor-driving device in the third island region 9. In this embodiment, the fourth island region 10 is constructed to surround the first and second island regions 7 and 8 which construct the small signal section 2.

Although not shown, an LOCOS oxide film, a silicon oxide film, etc. are deposited on the upper surface of the epitaxial layer 5. A barrier metal layer and an aluminum layer are deposited thereon through contact holes in the silicon oxide film etc., and then an electrode is formed. The devices formed in the first island region 7, the second island region 8, the third island region 9, and the fourth island region 10 will be described hereinbelow.

The NPN transistor formed in the first island region 7 will first be described. An N-type embedded diffusion region 13 is formed at the boundary between the substrate 4 and the epitaxial layer 5, as shown in FIG. 1. The epitaxial layer 5 used as collector region has a P-type diffusion region 14 and an N-type diffusion region 15 extending from the surface. For example, the P-type diffusion region 14 is used as base region and the N-type diffusion region 15 is used as collector leading region. An N-type diffusion region 16 extends from the surface of the P-type diffusion region 14. The N-type diffusion region 16 is used as emitter region. Thus the NPN transistor is constructed.

The horizontal PNP transistor formed in the second island region 8 will then be described. An N-type embedded diffusion region 17 is formed at the boundary between the substrate 4 and the epitaxial layer 5, as shown in FIG. 1. The epitaxial layer 5 used as base region has P-type diffusion regions 18 and 19 and an N-type diffusion region 20 extending from the surface. For example, the P-type diffusion region 18 is used as emitter region and the P-type diffusion regions 19 are used as collector region. Although the P-type diffusion regions 19 are separated in FIG. 1, they are actually integrated so as to surround the P-type diffusion region 18 serving as emitter region. The N-type diffusion region 20 is used as base leading region. Thus the horizontal PNP transistor is constructed.

The power NPN transistor 3 formed in the third island region 9 will then be described. An N-type embedded diffusion region 21 is formed at the boundary between the substrate 4 and the epitaxial layer 5, as shown in FIG. 1. N-type diffusion regions 22 extend from the surface of the epitaxial layer 5. The N-type diffusion regions 22 connect to the N-type embedded diffusion region 21. A P-type diffusion region 23 extending from the surface of the epitaxial layer 5 is formed in the region between the N-type diffusion regions 22. An N-type diffusion region 24 extends from the surface of the P-type diffusion region 23. In this embodiment, the N-type epitaxial layer 5 is used as collector region. The N-type embedded diffusion region 21 and the N-type diffusion region 22 are used as collector leading region. The P-type diffusion region 23 is used as base region and the N-type diffusion region 24 is used as emitter region. Thus the power NPN transistor 3 is constructed.

In this embodiment, an NPN transistor carrying a main current of the order of several milliamperes is referred to as an NPN transistor; an NPN transistor carrying a main current of the order of several amperes is referred to as a power NPN transistor.

An N-type diffusion region having supply potential formed in the fourth island region 10 will be described. An N-type embedded diffusion region 25 is formed at the boundary between the substrate 4 and the epitaxial layer 5, as shown in FIG. 1. An N-type diffusion region 26 extends from the surface of the epitaxial layer 5. The N-type embedded diffusion region 25 and the N-type diffusion region 26 are connected together. Supply voltage is applied to the N-type diffusion region 26. Accordingly, free carriers (electrons) generated when back electromotive force of a motor is applied to the power NPN transistor 3 can be attracted. In this embodiment, the fourth island region 10 has no IC device and is used as a dummy island region.

As described above, in this embodiment, the fourth island region 10 is disposed so as to surround the first and second island regions 7 and 8 which construct the small signal section 2. The first, second, and fourth island regions 7, 8, and 10 have an N-type embedded diffusion region 27 at the boundary between the substrate 4 and the epitaxial layer 5. The N-type embedded diffusion region 27 connects to the N-type embedded diffusion region 25 in the fourth island region 10. With such a structure, the first and second island regions 7 and 8 serving as the small signal section 2 are surrounded by the connected N-type diffusion regions 25, 26, and 27. Briefly, in the fourth island region 10, the N-type diffusion region 26 has supply potential and as such, the region of the small signal section 2 is surrounded by the N-type diffusion regions 25, 26, and 27 having supply potential.

The fourth island region 10 must not necessarily be constructed to surround the small signal section 2, as described above. For example, the fourth island region 10 may be disposed for each of the island regions of the small signal section 2. In that case, the N-type diffusion region having supply potential may be disposed at any position in the fourth island region 10.

In this embodiment, the first and second island regions 7 and 8 which construct the small signal section 2 has a P-type embedded diffusion region 28 at the boundary between the substrate 4 and the epitaxial layer 5, as shown in FIG. 1. The P-type embedded diffusion region 28 connects to the dividing regions 6 which partition the island regions 7 and 8, so that it is grounded. The P-type embedded diffusion region 28 partially overlaps with the N-type embedded diffusion region 27 and is located closer to the surface of the epitaxial layer 5 relative to the N-type embedded diffusion region 27. Thus, the grounded P-type embedded diffusion region 28 serves as the substrate in the island regions 7 and 8 having the small signal section 2.

FIG. 2 shows part of the circuit diagram of the semiconductor integrated circuit device 1 according to the embodiment, serving as driver IC for driving a motor. For example, the power line for driving a motor connects to the collector electrode of a power NPN transistor A serving as a motor-driving device. The emitter electrode of the power NPN transistor A and the output terminal of the motor are connected together. The collector electrode of a horizontal PNP transistor C serving as control device and the base electrode of the power NPN transistor A are connected via a resistor R1. The emitter electrode of the horizontal PNP transistor C connects to the power line. The base electrode of the horizontal PNP connects to, for example, the base electrode of the other horizontal PNP transistor serving as current mirror circuit and then connects to the power line via the other horizontal PNP transistor.

With such a circuit structure, during ON to OFF transition of the power NPN transistor 4 serving as driver device, for example, back electromotive force is generated from the motor. Thereafter the back electromotive force is applied to the power NPN transistor 3. Thus a negative potential is applied to the collector region of the power NPN transistor 3. The P-type substrate 4 is grounded via the dividing regions 6 which partition the third island region 9. Accordingly, the parasitic NPN transistor including the N-type embedded diffusion region 21 of the power NPN transistor 3, the P-type substrate 4, and the N-type embedded diffusion region 27 of the small signal section 2 is forward-biased at the junction between the emitter region and the base region (hereinafter, referred to as a parasitic junction). As a result, free carriers (electrons) are generated.

According to the embodiment, however, with the foregoing device structure, the free carriers (electrons) generated from the parasitic junction of the power NPN transistor 3 are prevented from flowing into the small signal section 2 through the substrate 4. Specifically, the island regions 7 and 8 having the small signal section 2 are surrounded by the fourth island region 10. The fourth island region 10 has the N-type diffusion regions 25 and 26 having supply potential. The N-type embedded diffusion region 25 connects to the N-type embedded diffusion region 27. The substrate 4 and the epitaxial layer 5 are thus partitioned by the N-type embedded diffusion region 27 having supply potential in the small signal section 2.

Thus, the free carriers (electrons) generated from the power NPN transistor 3 pass through the substrate 4 into the N-type embedded diffusion region 27 having supply potential. The flowing free carriers (electrons) are attracted through the N-type diffusion regions 25 and 26 in the fourth island region 10.

In that case, the epitaxial layer 5 and the N-type embedded diffusion region 27 are separated from each other by the grounded P-type embedded diffusion region 28 in the island regions 7 and 8 having the small signal section 2. This prevents the inflow of the free carriers (electrons) into the NPN transistor and the horizontal PNP transistor which construct the small signal section 2, thus preventing a malfunction that the transistors turn on in OFF mode. This prevents the power NPN transistor 3 serving as driver device from turning on in OFF mode due to the malfunction of the NPN transistor and the horizontal PNP transistor serving as the small signal section 2.

Figure 3:
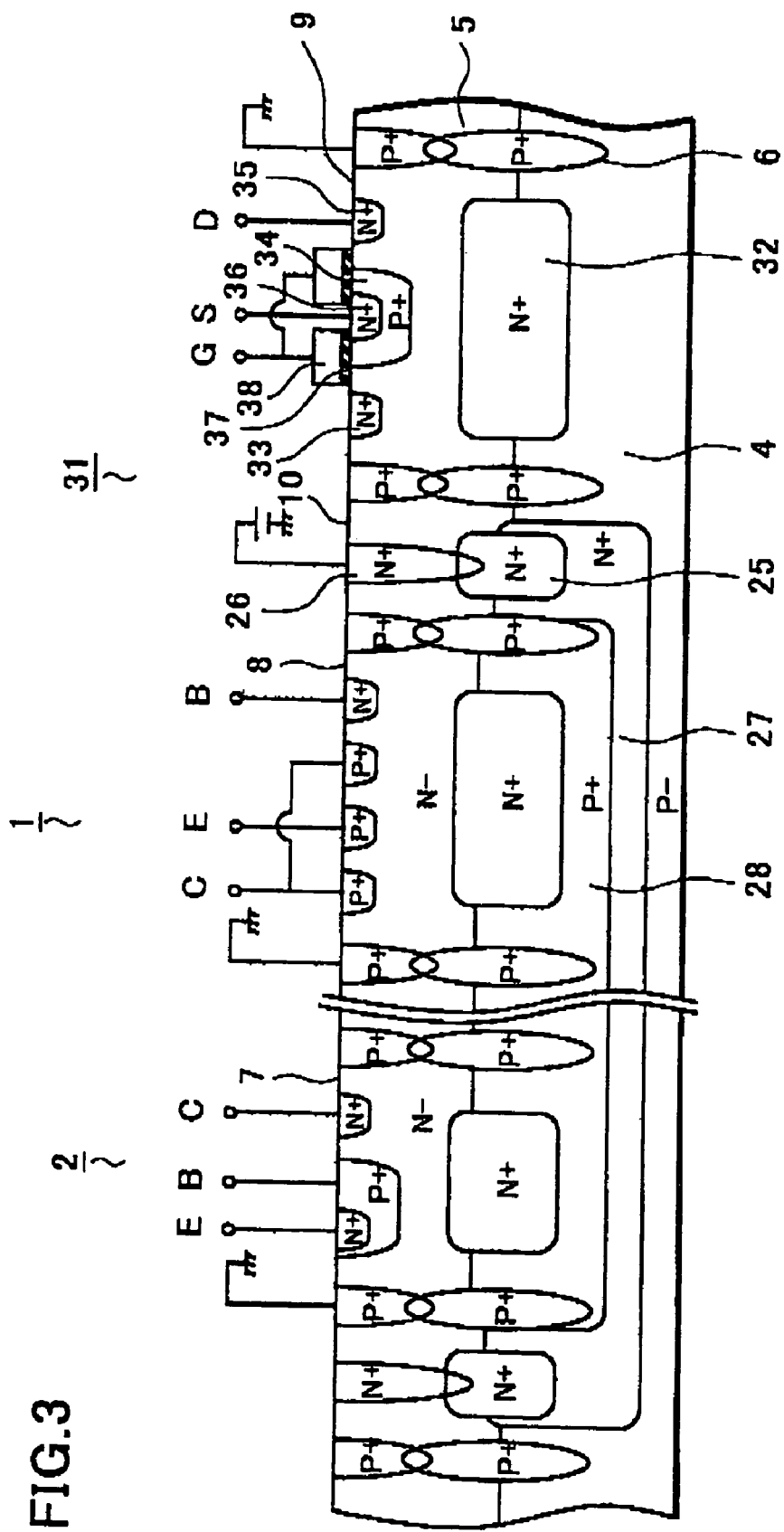
FIG. 3 is a cross-sectional view of a semiconductor integrated circuit device according to another embodiment of the invention.

Referring to FIG. 3, in this embodiment, a power MOS transistor 31 may be used as motor-driving device. Since the devices disposed in the first island region 7, the second island region 8, and the fourth island region 10 are the same as those of FIG. 1, their description will be omitted here. The same components as those of the semiconductor integrated circuit device of FIG. 1 will be given the same reference numerals in the following description.

The N-type epitaxial layer 5 in a thickness of 2 to 10 μm is deposited on the P-type monocrystal silicon substrate 4. The substrate 4 and the epitaxial layer 5 are divided into the first island region 7, the second island region 8, the third island region 9, and the fourth island region 10 by the P-type dividing regions 6 which pass therethrough. As in FIG. 1, the first island region 7 has an NPN transistor and the second island region 8 has a horizontal PNP transistor. The devices disposed in the island regions 7 and 8 construct the small signal section 2.

In this embodiment, the power MOS transistor 31 may be used as motor-driving device. As shown in FIG. 3, the third island region 9 has an N-type embedded diffusion region 32 at the boundary between the substrate 4 and the epitaxial layer 5, and has N-type diffusion regions 33 and 35 and a P-type diffusion region 34 extending from the surface of the epitaxial layer 5. The P-type diffusion region 34 has an N-type diffusion region 36 extending from the surface thereof. The epitaxial layer 5 has a gate electrode 38 on the surface thereof via a gate oxide film 37. The power MOS transistor 31 of this embodiment is constructed such that the N-type diffusion regions 33 and 35 are used as drain region, the N-type diffusion region 36 as source region, and the P-type diffusion region 34 as channel region. In this embodiment, the MOS transistor having a main current of, e.g., several amperes is referred to as a power MOS transistor.

In this embodiment, also when the power MOS transistor 31 is used as motor-driving device, a negative potential is applied to the drain region of the power MOS transistor 31 serving as driver device by the back electromotive force of the motor during ON to OFF transition of the power MOS transistor 31, as with the power NPN transistor 3. The parasitic NPN transistor including the N-type embedded diffusion region 32 of the power MOS transistor 31, the P-type substrate 4, and the N-type embedded diffusion region 27 of the small signal section 2 is forward-biased at the junction between the emitter region and the base region (hereinafter, referred to as a parasitic junction). As a result free carriers (electrons) aregenerated.

As has been described with reference to FIG. 1, however, the substrate 4 and the epitaxial layer 5 are partitioned by the N-type embedded diffusion region 27 having supply potential in the island regions 7 and 8 having the small signal section 2. This prevents the free carriers (electrons) from flowing into the island regions of the small signal section 2. The P-type embedded diffusion region 28 partially overlaps with the N-type embedded diffusion region 27 and is located closer to the surface of the epitaxial layer 5 relative to the N-type embedded diffusion region 27. Thus, the grounded P-type embedded diffusion region 28 serves as the substrate in the island regions 7 and 8 serving as the small signal section 2.

Figure 4:
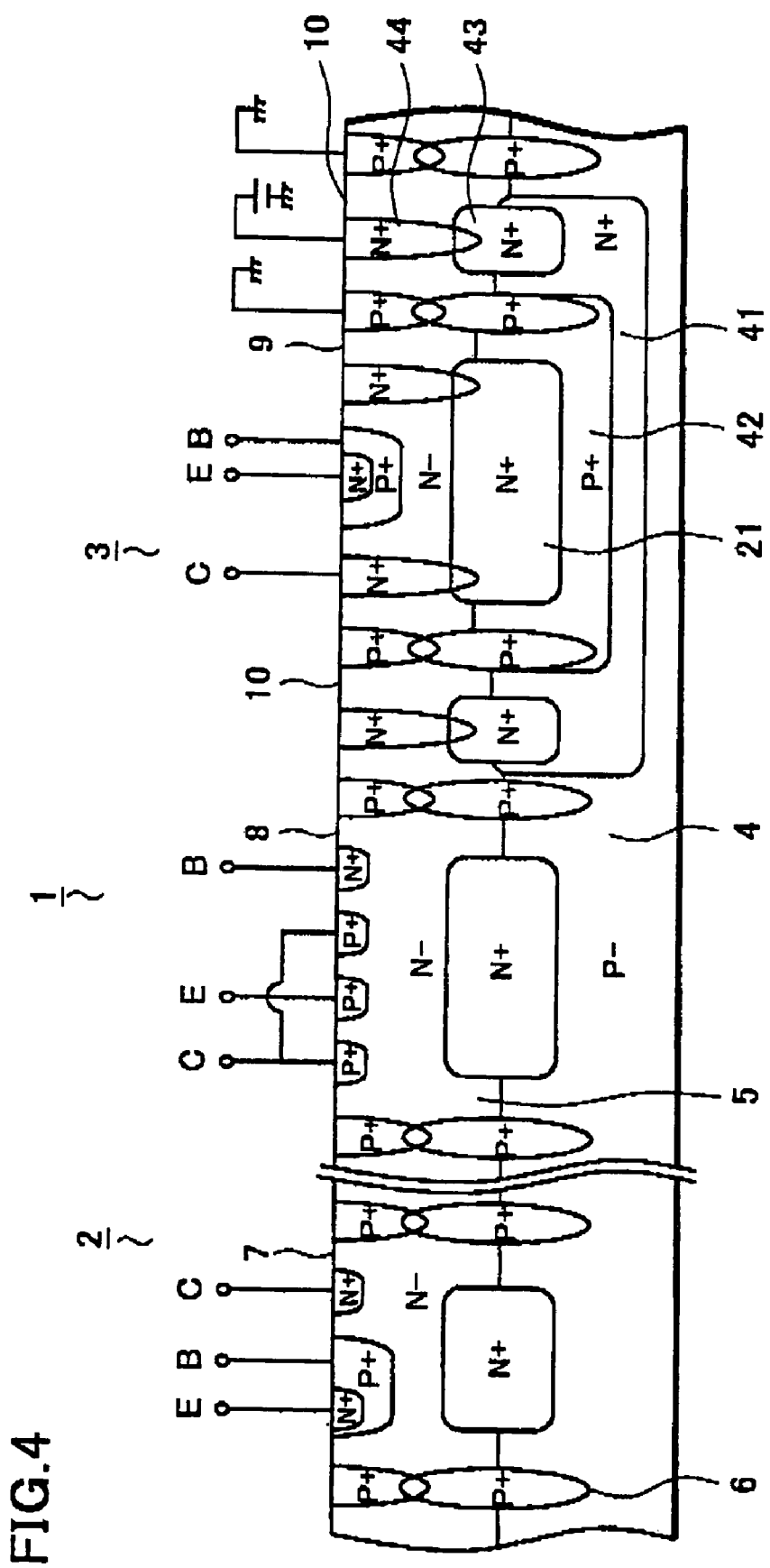
FIG. 4 is a cross-sectional view of a semiconductor integrated circuit device according to another embodiment of the invention.

Referring then to FIG. 4, in this embodiment, the power NPN transistor 3 is used as motor-driving device, in which the substrate 4 and the epitaxial layer 5 in the island region of the driver device may be partitioned by an N-type embedded diffusion region having supply potential. Since the devices disposed in the first island region 7, the second island region 8, and the third island region 9 are the same as those of FIG. 1, their description will be referenced here. The same components as those of the semiconductor integrated circuit device 1 in FIG. 1 will be given the same reference numerals in the following description.

The N-type epitaxial layer 5 in a thickness of 2 to 10 μm is deposited on the P-type monocrystal silicon substrate 4. The substrate 4 and the epitaxial layer 5 are divided into the first island region 7, the second island region 8, the third island region 9, and the fourth island region 10 by the P-type dividing regions 6 which pass therethrough. As in FIG. 1, the first island region 7 has an NPN transistor and the second island region 8 has a horizontal PNP transistor. The devices disposed in the island regions 7 and 8 construct the small signal section 2.

In this embodiment, the power NPN transistor 3 is used as motor-driving device. The power NPN transistor 3 is disposed in the third island region 9. The fourth island region 10 is disposed so as to surround the third island region 9. As with FIG. 1, the fourth island region 1 has N-type diffusion regions 43 and 44 having supply potential. The third and fourth island regions 9 and 10 have an N-type embedded diffusion region 41 at the boundary between the substrate 4 and the epitaxial layer 5. The N-type diffusion region 43 connects to the N-type embedded diffusion region 41. The power NPN transistor 3 is thus surrounded by the N-type diffusion regions 41, 43, and 44 having supply potential.

As described above, the fourth island region 10 must not necessarily be constructed to surround the small signal section 2. For example, the fourth island region 10 may be disposed for each of the island regions of the small signal section 2. In that case, the N-type diffusion region having supply potential may be disposed at any position in the fourth island region 10.

In this embodiment, the third island region 9 serving as the power NPN transistor 3 has a P-type embedded diffusion region 42 at the boundary between the substrate 4 and the epitaxial layer 5, as shown in FIG. 4. The P-type embedded diffusion region 42 connects to the dividing regions 6 which partition the island region 9 and as such, it is grounded. The P-type embedded diffusion region 42 partially overlaps with the N-type embedded diffusion region 41 and is located closer to the surface of the epitaxial layer 5 relative to the. N-type embedded diffusion region 41. Thus, the grounded P-type embedded diffusion region 42 serves as the substrate in the third island region 9.

In this embodiment, during ON to OFF transition of the motor of the power NPN transistor 3 serving as driver device, for example, a negative potential is applied to the drain region of the power NPN transistor 3 by the back electromotive force of the motor. The parasitic NPN transistor including the N-type embedded diffusion region 21 of the power NPN transistor 3, the P-type embedded diffusion region 42, and the N-type embedded diffusion region 41 having supply potential is forward-biased at the junction between the emitter region and the base region (hereinafter, referred to as a parasitic junction). As a result, free carriers (electrons) are generated.

However, since the third island region 9 is surrounded by the N-type diffusion regions 41, 43, and 44 having supply potential, the free carriers (electrons) are prevented from flowing into the island region of the small signal section 2. In other words, the free carriers (electrons) generated from the forward-biased parasitic junction flow into the N-type diffusion regions 41, 43, and 44 and are attracted. This prevents the NPN transistor and the horizontal PNP transistor serving as the small signal section 2 from turning on in OFF mode due to flow of the free carriers (electrons). This prevents the power NPN transistor 3 serving as driver device from turning on in OFF mode due to the malfunction of the NPN transistor and the horizontal PNP transistor serving as the small signal section 2.

Figure 5:
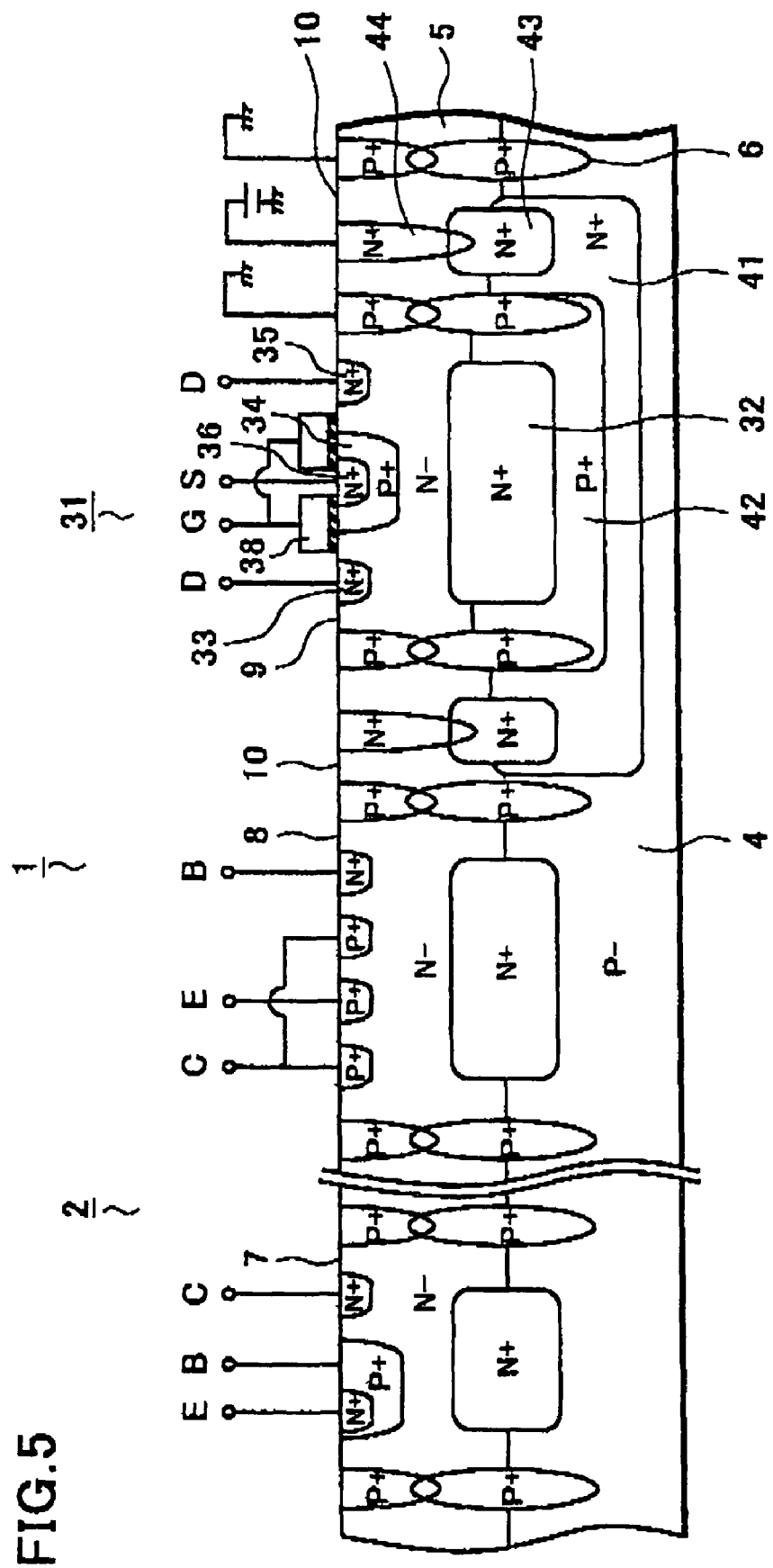
FIG. 5 is a cross-sectional view of a semiconductor integrated circuit device according to another embodiment of the invention.

Referring to FIG. 5, in this embodiment, the power MOS transistor 31 may be used as motor-driving device in the semiconductor integrated circuit device 1 of FIG. 4. Since the devices disposed in the first island region 7, the second island region 8, and the fourth island region 10 are the same as those of FIG. 4, their description will be omitted here. The same components as those in the semiconductor integrated circuit device 1 of FIGS. 1, 3 and 4 will be given the same reference numerals in the following description.

The N-type epitaxial layer 5 in a thickness of 2 to 10 μm is deposited on the P-type monocrystal silicon substrate 4. The substrate 4 and the epitaxial layer 5 are divided into the first island region 7, the second island region 8, the third island region 9, and the fourth island region 10 by the P-type dividing regions 6 which pass therethrough. As in FIG. 1, the first island region 7 has an NPN transistor and the second island region 8 has a horizontal PNP transistor. The devices disposed in the island regions 7 and 8 construct the small signal section 2.

In this embodiment, the power MOS transistor 31 may be used as motor-driving device. As shown in FIG. 5, the third island region 9 has the N-type embedded diffusion region 32 at the boundary between the substrate 4 and the epitaxial layer 5, and has N-type diffusion regions 33 and 35 and the P-type diffusion region 34 extending from the surface of the epitaxial layer 5. The N-type diffusion region 36 extends from the surface of the P-type diffusion region 34. The epitaxial layer 5 has a gate electrode 38 on the surface thereof via a gate oxide film 37. The power MOS transistor 31 of this embodiment is constructed such that the N-type diffusion regions 33 and 35 are used as drain region, the N-type diffusion region 36 as source region, and the P-type diffusion region 34 as channel region. In this embodiment, the MOS transistor having a main current of, e.g., the order of several amperes is referred to as a power MOS transistor.

In this embodiment, the third island region 9 serving as the power MOS transistor 31 has the P-type embedded diffusion region 42 at the boundary between the substrate 4 and the epitaxial layer 5, as shown in FIG. 5. The P-type embedded diffusion region 42 connects to the dividing regions 6 which partition the island region 9 and as such, it is grounded. The P-type embedded diffusion region 42 partially overlaps with the N-type embedded diffusion region 41 and is located closer to the surface of the epitaxial layer 5 relative to the N-type embedded diffusion region 41. Thus, the grounded P-type embedded diffusion region 42 serves as the substrate in the third island region 9.

In this embodiment, during ON to OFF transition of the power MOS transistor 31 serving as driver device, for example, a negative potential is applied to the drain region of the power MOS transistor 31 by the back electromotive force of the motor. The parasitic NPN transistor including the N-type embedded diffusion region 32 of the power MOS transistor 31, the P-type embedded diffusion region 42, and the N-type embedded diffusion region 41 having supply potential is forward-biased at the junction between the emitter region and the base region (hereinafter, referred to as a parasitic junction). As a result, free carriers (electrons) are generated.

However, since the third island region 9 is surrounded by the N-type diffusion regions 41, 43, and 44 having supply potential, as in FIG. 4, the free carriers (electrons) are prevented from flowing into the island regions of the small signal section 2. In other words, the free carriers (electrons) generated from the forward-biased parasitic junction flow into the N-type diffusion regions 41, 43, and 44 and are attracted. This prevents the NPN transistor and the horizontal PNP transistor serving as the small signal section 2 from turning on in OFF mode due to the parasitic current. This prevents the power NPN transistor 3 serving as driver device from turning on in OFF mode due to the malfunction of the NPN transistor and the horizontal PNP transistor serving as the small signal section 2.

The embodiments have been described for the case in which the N-type embedded diffusion region having supply potential is disposed between the substrate and the epitaxial layer in the driving-device formed region or, alternatively, between the substrate and the epitaxial layer in the small signal section. However, the embodiments of the invention are not limited to those. For example, the N-type embedded diffusion region may be disposed in each of the driver-device formed region and the control-device formed region or, alternatively, the N-type embedded diffusion region may be disposed in all the regions other than the driver-device formed region. Various other modifications can be made in the embodiments of the invention without departing from the sprit and scope thereof.

What is claimed is:

1. A semiconductor integrated circuit device comprising:
a semiconductor layer with a plurality of island regions including at least an island region incorporating a driver device for driving a motor, an island region incorporating a control device for controlling the driver device, and a surrounding island region that surrounds the island region incorporating the control device,
wherein the semiconductor layer further includes dividing regions dividing the semiconductor layer into the plurality of island regions, including a first dividing region between the island region incorporating the driver device and the surrounding island region and a second dividing region between the surrounding island region and the island region incorporating the control device,
wherein the island region incorporating the control device has a first first-conductivity-type embedded diffusion region having supply potential, the first first-conductivity-type embedded diffusion region disposed so as to separate an opposite-conductivity-type semiconductor substrate of the semiconductor layer from a region where the control device is formed, and
wherein the surrounding island region has a first-conductivity-type diffusion region having supply potential, and the semiconductor layer within the surrounding island region is disposed around the first-conductivity-type diffusion region and between the first-conductivity-type diffusion region and the second dividing region.

2. The semiconductor integrated circuit device according to claim 1, wherein the island region incorporating the control device has a grounded opposite-conductivity-type embedded diffusion region, the opposite-conductivity-type embedded diffusion region being disposed closer to a surface of the semiconductor layer relative to the first first-conductivity-type embedded diffusion region.

3. The semiconductor integrated circuit device according to claim 2, wherein the semiconductor layer comprises the semiconductor substrate, a first-conductivity-type epitaxial layer, and a second first-conductivity-type embedded diffusion region, wherein the second first-conductivity-type embedded diffusion region and the opposite-conductivity-type embedded diffusion region overlap between the semiconductor substrate and the first-conductivity-type epitaxial layer.

4. The semiconductor integrated circuit device according to claim 1, wherein the semiconductor layer above an upper surface of the first first-conductivity-type embedded diffusion region includes a plurality of island regions incorporating the control device.

5. A semiconductor integrated circuit device comprising:
a semiconductor layer with a plurality of island regions including at least an island region incorporating a driver device for driving a motor, an island region incorporating a control device for controlling the driver device, and a surrounding island region disposed so as to surround the island region incorporating the driver device,
wherein the semiconductor layer further includes dividing regions dividing the semiconductor layer into the plurality of island regions including a first dividing region between the island region incorporating the driver device and the surrounding island region and a second dividing region between the surrounding island region and the island region incorporating the control device, wherein the island region incorporating the driver device has a first first-conductivity-type embedded diffusion region having supply potential, the first first-conductivity-type embedded diffusion region disposed so as to separate an opposite-conductivity-type semiconductor substrate of the semiconductor layer from a region where the driver device is formed, and wherein the surrounding island region has a first-conductivity-type diffusion region having supply potential, and the semiconductor layer within the surrounding island region is disposed around the first-conductivity-type diffusion region and between the first-conductivity-type diffusion region and the first dividing region.

6. The semiconductor integrated circuit device according to claim 5, wherein the island region incorporating the driver device has a grounded opposite-conductivity-type embedded diffusion region, the opposite-conductivity-type embedded diffusion region being disposed closer to a surface of the semiconductor layer relative to the first first-conductivity-type embedded diffusion region.

7. The semiconductor integrated circuit device according to claim 6, wherein the semiconductor layer comprises the semiconductor substrate, a first-conductivity-type epitaxial layer, and a second first-conductivity-type embedded diffusion, wherein the second first-conductivity-type embedded diffusion region and the opposite-conductivity-type embedded diffusion region overlap between the semiconductor substrate and the first-conductivity-type epitaxial layer.

8. The semiconductor integrated circuit device according to claim 1 or 2, wherein the first first-conductivity-type embedded diffusion region connects to the first-conductivity-type diffusion region.

9. The semiconductor integrated circuit device according to claim 5 or 6, wherein the first first-conductivity-type embedded diffusion region connects to the first-conductivity-type diffusion region.

10. The semiconductor integrated circuit device according to claim 1, wherein the dividing regions and the opposite-conductivity-type semiconductor substrate are grounded.

11. The semiconductor integrated circuit device according to claim 5, wherein the dividing regions and the opposite-conductivity-type semiconductor substrate are grounded.

* * * * *